United States Patent
Swaminathan

(10) Patent No.: US 10,358,740 B2
(45) Date of Patent: Jul. 23, 2019

(54) CRYSTAL GROWING SYSTEMS AND METHODS INCLUDING A PASSIVE HEATER

(71) Applicant: SunEdison, Inc., St. Peters, MO (US)

(72) Inventor: Tirumani Swaminathan, Houston, TX (US)

(73) Assignee: Corner Star Limited, Hong Kong (HK)

( * ) Notice: Subject to any disclaimer, the term of this patent is extended or adjusted under 35 U.S.C. 154(b) by 973 days.

(21) Appl. No.: 14/341,580

(22) Filed: Jul. 25, 2014

(65) Prior Publication Data
US 2016/0024685 A1 Jan. 28, 2016

(51) Int. Cl.
| | | |
|---|---|---|
| C30B 15/12 | (2006.01) | |
| C30B 15/14 | (2006.01) | |
| C30B 15/20 | (2006.01) | |
| C30B 29/06 | (2006.01) | |
| C30B 15/00 | (2006.01) | |

(52) U.S. Cl.
CPC ............ *C30B 15/14* (2013.01); *C30B 15/002* (2013.01); *C30B 15/12* (2013.01); *C30B 15/206* (2013.01); *C30B 29/06* (2013.01); Y10T 117/1052 (2015.01); Y10T 117/1068 (2015.01)

(58) Field of Classification Search
CPC ....... C30B 15/12; C30B 15/14; C30B 15/206; Y10T 117/1052; Y10T 117/1068
See application file for complete search history.

(56) References Cited

U.S. PATENT DOCUMENTS

| | | | |
|---|---|---|---|
| 4,330,362 A * | 5/1982 | Zulehner | ............... C30B 15/02 117/13 |
| 5,087,321 A | 2/1992 | Kamio et al. | |
| 5,270,020 A | 12/1993 | Suzuki et al. | |
| 5,567,399 A | 10/1996 | Von Ammon et al. | |
| 5,720,810 A * | 2/1998 | Arai | ..................... C30B 15/12 117/208 |
| 5,858,087 A | 1/1999 | Taguchi et al. | |

(Continued)

FOREIGN PATENT DOCUMENTS

| | | |
|---|---|---|
| CN | 101560691 A | 10/2009 |
| EP | 0340941 A1 | 11/1989 |

(Continued)

OTHER PUBLICATIONS

International Search Report and Written Opinion of the International Searching Authority issued in connection with PCT/US2015/041727 dated Oct. 29, 2015; 13 pgs.

*Primary Examiner* — Matthew J Song
(74) *Attorney, Agent, or Firm* — Armstrong Teasdale LLP

(57) ABSTRACT

A system for growing a crystal ingot from a melt is provided. The system includes a crucible assembly, a first heater, a second heater, and a passive heater. The crucible assembly includes a crucible and a weir separating an outer melt zone of the melt from an inner melt zone of the melt. The first heater is configured to supply thermal energy to the melt by conduction through the crucible. The second heater is configured to generate thermal radiation. The passive heater is configured to supply thermal energy to the outer melt zone by transferring thermal radiation generated by the second heater to the outer melt zone.

25 Claims, 2 Drawing Sheets

(56) References Cited

U.S. PATENT DOCUMENTS

| | | | |
|---|---|---|---|
| 5,935,326 A * | 8/1999 | Kotooka | C30B 15/14 117/217 |
| 6,197,111 B1 | 3/2001 | Ferry et al. | |
| 7,294,203 B2 | 11/2007 | Harada et al. | |
| 8,262,797 B1 * | 9/2012 | Bender | C30B 29/06 117/217 |
| 8,317,919 B2 | 11/2012 | Bender | |
| 2002/0100410 A1 * | 8/2002 | Kim | C30B 15/20 117/13 |
| 2004/0200408 A1 * | 10/2004 | Wang | C30B 15/02 117/208 |
| 2008/0053372 A1 * | 3/2008 | Anttila | C30B 15/14 117/200 |
| 2010/0229785 A1 * | 9/2010 | Abe | C30B 15/16 117/13 |
| 2010/0326349 A1 | 12/2010 | Fukui et al. | |
| 2012/0279438 A1 * | 11/2012 | Ryu | C30B 15/22 117/35 |
| 2014/0144371 A1 | 5/2014 | Swaminathan | |
| 2014/0261155 A1 * | 9/2014 | Kimbel | C30B 15/12 117/31 |
| 2015/0140211 A1 * | 5/2015 | Strobl | C23C 16/26 427/249.6 |

FOREIGN PATENT DOCUMENTS

| | | |
|---|---|---|
| EP | 0229322 B1 | 8/1992 |
| WO | 2015084602 A1 | 6/2015 |

\* cited by examiner

CRYSTAL GROWING SYSTEMS AND METHODS INCLUDING A PASSIVE HEATER

FIELD

The field of the disclosure relates generally to systems and methods for producing ingots of semiconductor or solar material from a melt and, more particularly, to systems and methods for the transfer of heat to the melt.

BACKGROUND

In the production of silicon crystals grown by the continuous Czochralski (CCZ) method, polycrystalline silicon is first melted within a crucible, such as a quartz crucible, of a crystal pulling device to form a silicon melt. The puller then lowers a seed crystal into the melt and slowly raises the seed crystal out of the melt. As the seed crystal is grown from the melt, solid polysilicon is added to the melt to replenish the polysilicon that is incorporated into the growing crystal. The addition of polysilicon to the melt reduces the temperature of the melt where the solid polysilicon is added. As a result, additional heat is needed to melt the solid polysilicon, and maintain the melt in a liquid state.

Known crystal pulling devices use external heaters to conductively heat the melt through the crucible. Crucibles typically have a relatively low thermal conductivity, which tends to limit the rate at which thermal energy may be supplied to the melt. Limiting the rate at which thermal energy can be supplied to the melt may in turn limit the rate at which crystal ingots may be grown, thereby limiting the throughput of such devices.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for growing a crystal ingot from a melt is provided. The system includes a crucible assembly, a first heater, a second heater, and a passive heater. The crucible assembly includes a crucible and a weir separating an outer melt zone of the melt from an inner melt zone of the melt. The first heater is configured to supply thermal energy to the melt by conduction through the crucible. The second heater is configured to generate thermal radiation. The passive heater is configured to supply thermal energy to the outer melt zone by transferring thermal radiation generated by the second heater to the outer melt zone.

In another aspect, a system for growing a crystal ingot from a melt is provided. The system includes a crucible assembly and a secondary heating system. The crucible assembly includes a crucible and a weir separating an outer melt zone of the melt from an inner melt zone of the melt. The secondary heating system includes a passive heater, and is configured to supply thermal energy to the outer melt zone with the passive heater.

In yet another aspect, a method of growing a crystal ingot from a melt using a system is provided. The system includes a crucible assembly and a secondary heating system. The crucible assembly includes a crucible and a weir separating an outer melt zone of the melt from an inner melt zone of the melt. The secondary heating system includes an active heater and a passive heater. The method includes supplying thermal energy to the outer melt zone by transferring thermal radiation generated by the active heater to the outer melt zone using the passive heater.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
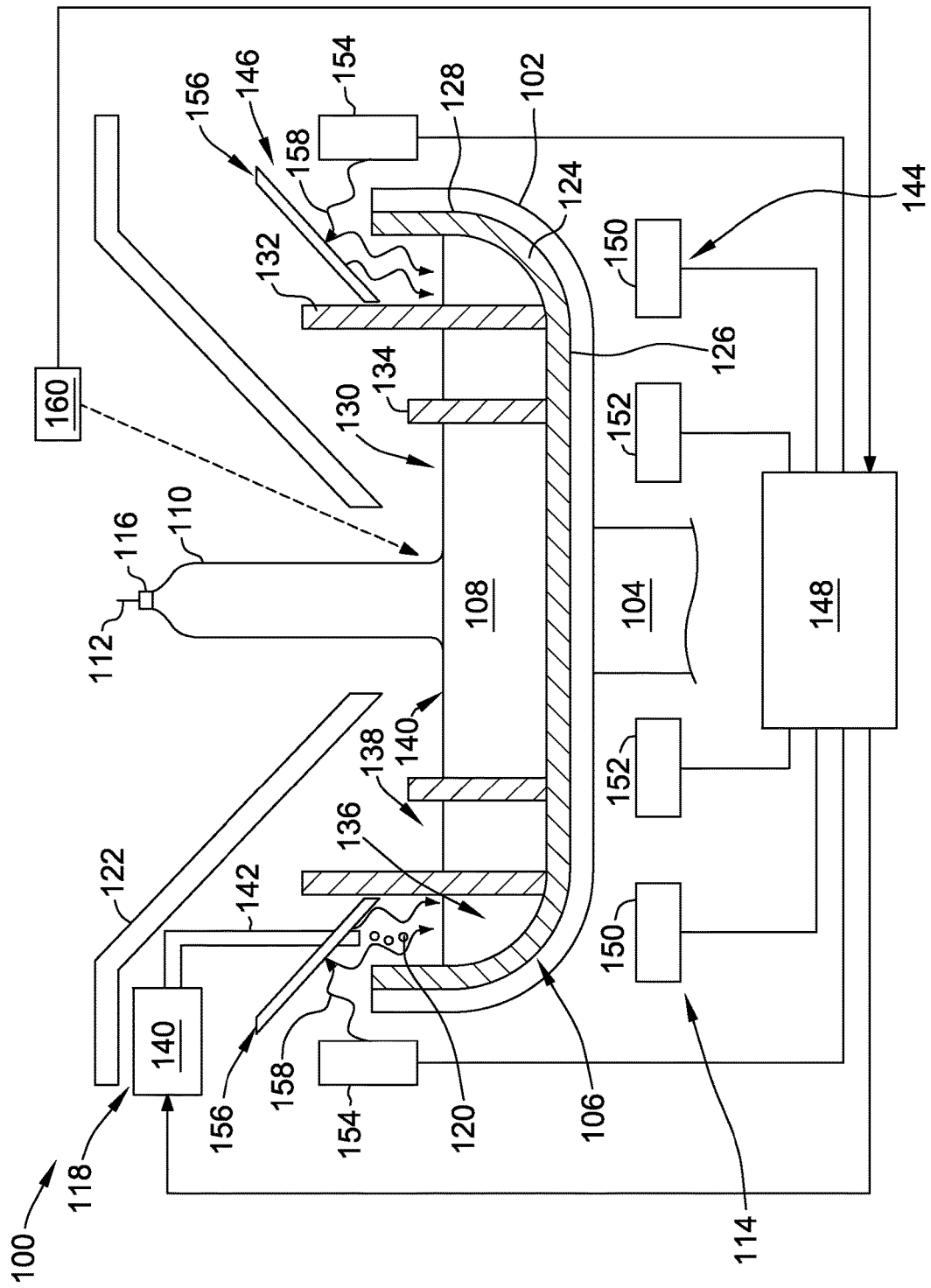
FIG. 1 is cross-section of a crystal growing system including a secondary heating system.

Referring to FIG. 1, a crystal growing system is shown schematically and is indicated generally at 100. The crystal growing system 100 is used to produce a single crystal ingot by a Czochralski method. As discussed herein, the system is described in relation to the continuous Czochralski method of producing single crystal ingots, though a batch process may be used. For example, the process may be used in a "recharge" CZ process.

The crystal growing system 100 includes a susceptor 102 supported by a rotatable shaft 104, a crucible assembly 106 that contains a silicon melt 108 from which an ingot 110 is being pulled by a puller 112, and a heating system 114 for supplying thermal energy to the system 100 and maintaining the melt 108. During the crystal pulling process, a seed crystal 116 is lowered by the puller 112 into the melt 108 and then slowly raised from the melt 108. As the seed crystal 116 is slowly raised from the melt 108, silicon atoms from the melt 108 align themselves with and attach to the seed crystal 116 to form the ingot 110.

The system 100 also includes a feed system 118 for feeding solid feedstock material 120 into the crucible assembly 106 and/or the melt 108, and a heat shield 122 configured to shield the ingot 110 from radiant heat from the melt 108 to allow the ingot 110 to solidify.

The crucible assembly 106 includes a crucible 124 having a base 126 and a generally annular sidewall 128 extending around the circumference of the base 126. Together, the base 126 and sidewall 128 define a cavity 130 of the crucible 124 within which the melt 108 is disposed. The crucible 124 may be constructed of any suitable material that enables system 100 to function as described herein, including, for example, quartz.

The crucible assembly 106 also includes a plurality of weirs 132, 134 that separate the melt 108 into different melt zones. In the illustrated embodiment, the crucible assembly 106 includes a first weir 132 separating an outer melt zone 136 of the melt 108 from an inner melt zone 138 of the melt 108, and a second weir 134 at least partially defining a growth zone 139 from which the ingot 110 is pulled. The first weir 132 and the second weir 134 each have a generally annular shape, and have at least one opening defined therein to permit the melt 108 to flow radially inwards towards the growth zone 139. The first weir 132 and the second weir 134 are disposed within the cavity 130 of crucible 124, and create a circuitous path from the outer melt zone 136 to the inner melt zone 138 and the growth zone 139. The weirs 132, 134 thereby facilitate melting solid feedstock material 120 before it reaches an area immediately adjacent to the growing crystal (e.g., the growth zone 139). The weirs 132, 134 may be constructed from any suitable material that enables the system 100 to function as described herein, including, for example, quartz. While the illustrated embodiment is shown and described as including two weirs, the system 100 may include any suitable number of weirs that enables the system 100 to function as described herein, such as such as one weir, three weirs, and four weirs.

In other embodiments, one or more weirs do not include openings. In these embodiments, movement of the melt 108 from the outer melt zone 136 to the inner melt zone 138 and/or the growth zone 139 is limited to movement above or below the weirs. In yet other embodiments, the crucible assembly 106 may include more than one crucible. For example, the crucible assembly may include a second crucible (not shown) positioned within the cavity 130 of the crucible 124 to separate the melt 108 into one or more melt zones.

The crucible 124, the first weir 132, and the second weir 134 may be formed separately from one another, and assembled to form the crucible assembly 106. In other suitable embodiments, the crucible assembly 106 may have a unitary construction. That is, the crucible 124 and one or both weirs 132, 134 may be integrally formed (e.g., formed from a unitary piece of quartz).

The feed system 118 includes a feeder 140 and a feed tube 142. Solid feedstock material 120 may be placed into the outer melt zone 136 from feeder 140 through feed tube 142. The amount of feedstock material 120 added to the melt 108 may be controlled by a controller (such as the controller 148, described below) based on a temperature reduction in the melt 108 resulting from the cooler feedstock material 120 being added to the melt 108.

The heat shield 122 is positioned adjacent the crucible assembly 106, and separates the melt 108 from an upper portion of the system 100. The heat shield 122 is configured to shield the ingot 110 from radiant heat generated by the melt 108 and the heating system 114 to allow the ingot 110 to solidify. In the example embodiment, the heat shield 122 includes a conical member separating the melt 108 from an upper portion of the system 100, and a central opening defined therein to allow the ingot 110 to be pulled therethrough. In other embodiments, the heat shield 122 may have any suitable configuration that enables the system 100 to function as described herein. As noted above, the heat shield 122 shields the ingot 110 from radiant heat generated by the melt 108 and the heating system 114 to allow the ingot 110 to solidify. In the illustrated embodiment, the heat shield 122 also inhibits line-of-sight projectiles from reaching the inner melt zone 138 during the addition of solid feedstock material 120, and at least partially inhibits gas flow in a radially inwards direction towards the inner melt zone 138. In the example embodiment, the heat shield 122 is constructed from graphite. In other embodiments, the heat shield 122 may be constructed from any suitable material that enables the system 100 to function as described herein, including, for example, silica-coated graphite, high purity molybdenum, and combinations thereof.

The heating system 114 includes a primary heating system 144 (broadly, a first heating system), a secondary heating system 146 (broadly, a second heating system), and a controller 148.

The primary heating system 144 is configured to melt an initial charge of solid feedstock (such as chunk polysilicon), and maintain the melt 108 in a liquefied state after the initial charge is melted. The primary heating system 144 includes a plurality of primary heaters 150, 152 arranged at suitable positions about the crucible assembly 106. In the illustrated embodiment, the primary heaters 150, 152 have a generally annular shape, and are positioned beneath the crucible 124 and the susceptor 102. More specifically, the primary heaters 150, 152 are positioned proximate an outer surface of the base 126 of the crucible and the susceptor 102. The primary heaters 150, 152 are thus configured to supply heat to the melt 108 by conduction through the susceptor 102 and the base 126 of the crucible 124. Primary heaters 150, 152 may also be positioned around and radially outward of the sidewall 128 of the crucible 124, and be configured to supply thermal energy to the melt 108 by conduction through the sidewall 128 of the crucible 124.

In the example embodiment, the primary heaters 150, 152 are resistive heaters, although the primary heaters 150, 152 may be any suitable heating device that enables system 100 to function as described herein. Further, while the illustrated embodiment is shown and described as including two primary heaters 150, 152, the system 100 may include any suitable number of primary heaters 150, 152 that enables the system 100 to function as described herein.

The secondary heating system 146 includes a secondary heater 154 and a passive heater 156. The secondary heater 154 has a generally annular configuration, and is disposed radially outward from the sidewall 128 of the crucible 124. The secondary heater 154 is an active heater. That is, the secondary heater 154 is configured to generate thermal energy in response to electric power supplied to the secondary heater 154 from a power source (not shown). In the example embodiment, secondary heater 154 is a resistive heater configured to generate thermal radiation (e.g., visible or infrared radiation), indicated by arrows 158 in FIGS. 1 and 2. In other suitable embodiments, secondary heater 154 may be any suitable heating device that enables system 100 to function as described herein. As noted above, primary heaters 150, 152 are also resistive heaters in the example embodiment, and are thus also referred to herein as active heaters.

The passive heater 156 is positioned radially outward from the heat shield 122, and is configured to transfer thermal energy generated by the secondary heater 154 to the outer melt zone 136. As used herein, the term "passive heater" refers to a heating element that supplies thermal energy to a target object (e.g., melt 108) by transferring thermal energy from an active heater (e.g., the secondary heater 154) to the target object. In the example embodiment, the passive heater 156 transfers energy from the secondary heater 154 to the outer melt zone 136 by (i) reflecting thermal radiation 158 generated by the secondary heater 154 towards the outer melt zone 136; and (ii) emitting thermal radiation (indicated by arrow 159 in FIG. 2) towards the outer melt zone 136 in response to absorbing thermal radiation 158 generated by the secondary heater 156. As described in more detail herein, the secondary heating system 146 facilitates melting solid feedstock material 120 added to the melt 108, and facilitates maintaining the temperature of the outer melt zone 136 when solid feedstock material 120 is added to the melt 108.

The primary heaters 150, 152 and secondary heater 154 are connected to the controller 148. The controller 148 controls electric current provided to the heaters 150, 152, 154 to control the amount of thermal energy supplied by heaters 150, 152, 154. The amount of current supplied to each of the heaters 150, 152, 154 by controller 148 may be separately and independently chosen to optimize the thermal characteristics of the melt 108. In the illustrated embodiment, the controller 148 also controls feed system 118 and the delivery of feedstock material 120 to the melt 108 to control the temperature of the melt 108.

A sensor 160, such as a pyrometer or like temperature sensor, provides a continuous measurement of the temperature of melt 108 at the crystal/melt interface of the growing single crystal ingot 110. Sensor 160 also may be configured to measure the temperature of the growing ingot 110. Sensor 160 is communicatively coupled with controller 148. Additional temperature sensors may be used to measure and provide temperature feedback to the controller 148 with respect to other areas of the melt 108 that are relevant to the melting of the feedstock material 120 or in controlling the growing ingot 110. While a single communication lead is shown for clarity, one or more temperature sensor(s) may be linked to the controller 148 by multiple leads or a wireless connection, such as by an infra-red data link or another suitable means.

During the continuous Czochralski method of producing single crystal ingots, feedstock material 120 is supplied to and melted in a radially outward area of the crucible 124 (e.g., the outer melt zone 136), while the crystal ingot 110 is simultaneously grown from the melt 108 in a radially inward area of the crucible 124 (e.g., the growth zone 139 or the inner melt zone 138). One limiting factor of the rate at which the crystal ingot 110 may be grown is the rate at which the melt 108 may be replenished with molten material. In other words, as the growth rate of the crystal ingot 110 increases (e.g., by increasing the pull speed of puller 112), the rate at which feedstock material 120 is added to the melt 108 must also increase to maintain the melt 108.

The feedstock material 120 is at a lower temperature than the surrounding melt 108, and absorbs heat from the melt 108 as the solid feedstock material 120 liquefies in the outer melt zone 136. As the solid feedstock material 120 (also referred to as "cold feedstock") absorbs energy from melt 108, the temperature of the melt 108 in the outer melt zone 136 falls proportionately to the energy absorbed. Additional thermal energy must be supplied to the outer melt zone 136 to compensate for the temperature reduction caused by the addition of cold feedstock, and to ensure cold feedstock is liquefied before reaching the inner melt zone 138 and/or the growth zone 139.

The primary heating system 144 is configured to supply thermal energy to the melt 108 by conduction through the susceptor 102 and the crucible 124. That is, thermal energy generated by the primary heaters 150, 152 is transferred to the melt 108 primarily by conduction through the susceptor 102 and the crucible 124. The crucible 124 is constructed of high-refractory, non-reactive materials, such as, for example, quartz. The crucible 124 thus has a relatively low thermal conductivity, thereby limiting the rate at which thermal energy may be transferred to the melt 108 by the primary heating system 144. Additionally, contact resistances between the susceptor 102 and the crucible 124 further limit the transfer rate of thermal energy from the primary heating system 144 to the melt 108.

The secondary heating system 146 is configured to supply additional thermal energy to a radially outer portion of the melt 108, such as the outer melt zone 136, by passive heating. As used herein, the term "passive heating" refers to processes in which the transfer of thermal energy from an active thermal radiation source to a target object occurs primarily by (i) the reflection of thermal radiation generated by the thermal radiation source towards the target object; and (ii) the transmittance of thermal radiation towards the target object in response to absorbing thermal radiation generated by the thermal radiation source. In the illustrated embodiment, for example, the passive heater 156 is configured to reflect thermal radiation 158 generated by the secondary heater 154 towards the outer melt zone 136, and emit thermal radiation 159 towards the outer melt zone 136 in response to absorbing thermal radiation 158 generated by the secondary heater 154. The passive heating of the secondary heating system 146 enables faster and more efficient heat transfer to the melt 108 as compared to conductive heating systems. The secondary heating system 146 thereby enables faster growth rates as compared to systems without passive heaters.

The secondary heater 154 and the passive heater 156 are positioned and oriented relative to one another such that the passive heater 156 reflects thermal radiation 158 generated by the secondary heater 154 towards the outer melt zone 136. Further, the secondary heater 154 and the passive heater 156 are positioned in direct thermal communication, and in this embodiment direct view or line-of-sight, with one another. That is, the path between the secondary heater 154 and the passive heater 156 along which thermal radiation 158 generated by the secondary heater 154 travels is substantially unobstructed by thermal radiation absorbing and/or reflecting objects (e.g., the crucible 124, the susceptor 102, weirs 132, 134, and the heat shield 122). The passive heater 156 is also positioned in direct view or line-of-sight with the outer melt zone 136. Thus, thermal radiation 158 generated by the secondary heater 154 is reflected, and absorbed and emitted by the passive heater 156, and travels along a substantially unobstructed path to the outer melt zone 136, where thermal radiation 158, 159 irradiates the melt 108.

In the illustrated embodiment, the secondary heater 154 is disposed radially outward from the sidewall 128 of the crucible 124, and the passive heater 156 is positioned at least partially above the outer melt zone 136. In other embodiments, the secondary heater 154 and the passive heater 156 may positioned in any suitable arrangement that enables the secondary heating system 146 to function as described herein.

The passive heater 156 has a generally frustoconical shape and a central opening defined therein to allow the ingot 110 to be pulled therethrough. The passive heater 156 is oriented at an angle 162 (shown in FIG. 2) with respect to a surface of the melt 108 in order to reflect thermal radiation 158 generated by the secondary heater 154 towards the outer melt zone 136. In the illustrated embodiment, for example, the passive heater 156 is oriented at an angle 162 of about 45 degrees. In other suitable embodiments, the angle 162 at which passive heater 156 is oriented may be between about 10 degrees and about 75 degrees, more suitably between about 15 degrees and 60 degrees, and, even more suitably, between about 30 degrees and about 50 degrees. In other embodiments, the passive heater 156 may have any suitable configuration that enables the passive heater 156 to reflect thermal radiation 158 generated by the secondary heater 154 towards the outer melt zone 136, and/or emit thermal radiation 159 towards the outer melt zone 136 in response to absorbing thermal radiation 158 generated by the secondary heater 154.

Figure 2:
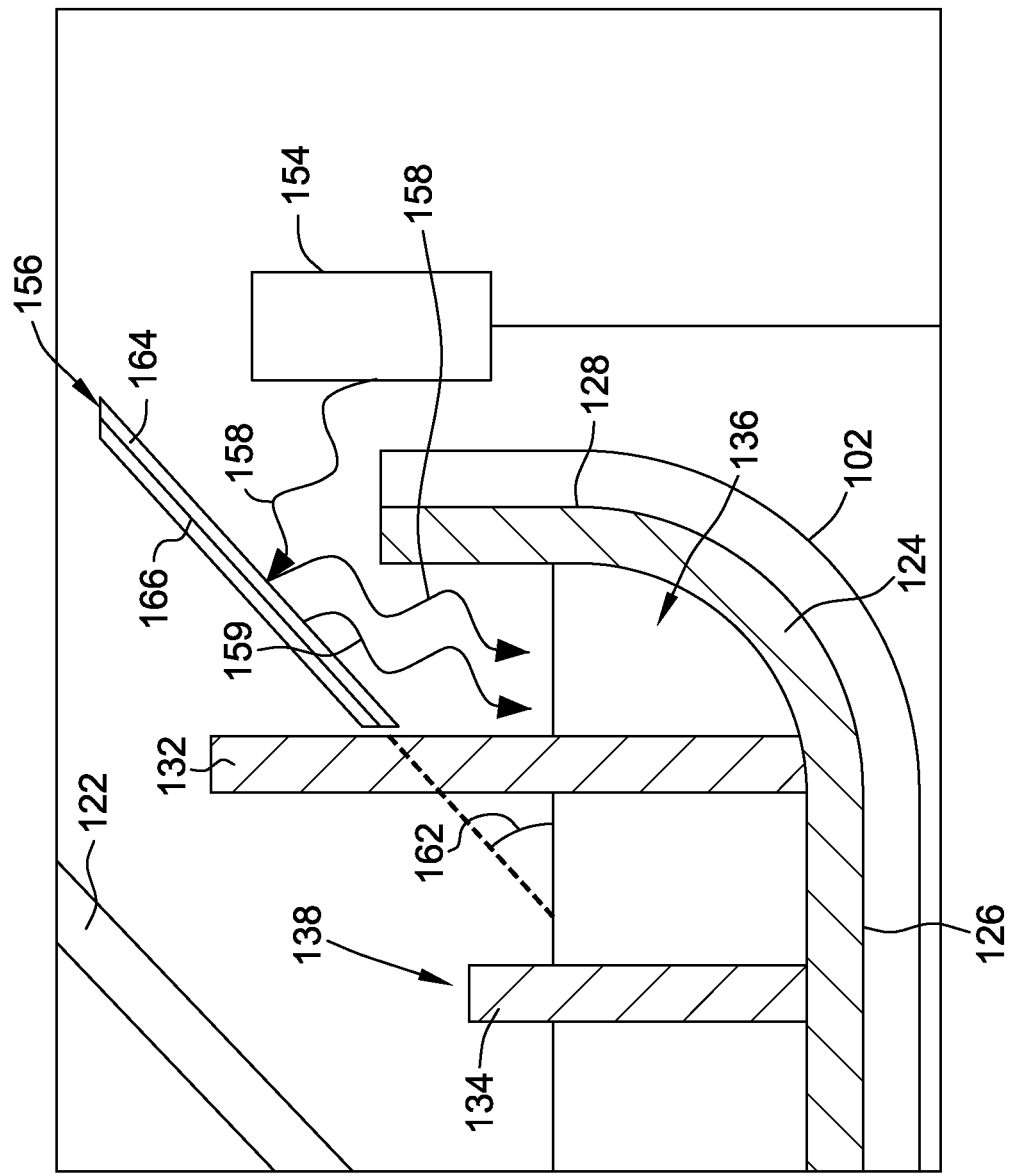
FIG. 2 is an enlarged view of FIG. 1 illustrating details of the secondary heating system of FIG. 1.

With additional reference to FIG. 2, the passive heater 156 has a multi-layer construction including a reflective layer 164 and an insulating layer 166. The reflective layer 164 is configured to reflect thermal radiation 158 generated by the secondary heater 154, and the insulating layer 166 is configured to insulate a radially inner portion of the system from heat generated by the melt 108, the primary heaters 150, 152, and/or the secondary heater 154.

The reflective layer 164 is positioned radially outward from the insulating layer 166. The reflective layer 164 may be constructed from a material having a relatively high emissivity including for example, graphite, silicon carbide, and combinations thereof. In other suitable embodiments, the reflective layer 164 may be constructed from any suitable material that enables the secondary heating system 146 to function as described herein.

The insulating layer 166 is positioned radially inward from the reflective layer 164. The insulating layer 166 may be constructed from a material having a relatively low emissivity including, for example, molybdenum. In other suitable embodiments, the insulating layer 166 may be constructed of any suitable insulating material that enables the secondary heating system 146 to function as described herein.

Although the passive heater 156 is illustrated and described as including two layers, the passive heater 156 may include any suitable number of reflective layers and insulating layers that enables the passive heater 156 to function as described herein. Further, in some suitable embodiments, the insulating layer 166 may be omitted from passive heater 156, and the passive heater 156 may include only reflective layers.

The total amount of thermal energy supplied to the outer melt zone 136 is a combination of the thermal energy supplied by all the heating elements of the crystal growing system 100. In the example embodiment, the total amount of thermal energy supplied to the outer melt zone 136 is a combination of the thermal energy supplied by conduction through the crucible 124 by the primary heaters 150, 152 and the secondary heater 154, and the thermal energy supplied by the passive heater 156. The secondary heating system 146, and more specifically, the secondary heater 156, is configured to supply the majority of the total amount of thermal energy supplied to the outer melt zone 136. For example, the passive heater 156 may be configured to supply at least about 50% of the total amount of thermal energy supplied to the outer melt zone 136, more suitably at least about 70% of the total amount of thermal energy supplied to the outer melt zone 136, and even more suitably, at least about 80% of the total amount of thermal energy supplied to the outer melt zone 136. In other words, less than about 50% of the total amount of thermal energy supplied to the outer melt zone 136 is supplied by conductive heating through the crucible 124, more suitably less than about 30% of the total amount of thermal energy supplied to the outer melt zone 136 is supplied by conductive heating through the crucible 124, and even more suitably, less than about 20% of the total amount of thermal energy supplied to the outer melt zone 136 is supplied by conductive heating through the crucible 124.

Embodiments of the crystal growing systems described herein provide several advantages over known crystal growing systems. For example, the crystal growing systems of the present disclosure provide a secondary heating system that facilitates melting solid feedstock material added to a melt before the feedstock material reaches a radially inner portion of the melt (e.g., where a crystal ingot is being grown). In particular, the crystal growing systems described herein include a passive heater configured to (i) reflect thermal radiation generated by an active heater towards a radially outer portion of the melt, and (ii) emit thermal radiation towards a radially outer portion of the melt in response to absorbing thermal radiation generated by the active heater. The configuration of the passive heater and the active heater facilitates enhanced heat transfer to the melt as compared to conductively heating the melt through a crucible in which the melt is held. The secondary heating system thereby enables thermal energy to be transferred to the melt faster and easier than conductive heating systems, thereby enabling higher growth rates at which crystal ingots may be grown. The secondary heating system also provides improved efficiency as compared to conductive heating systems by reducing the amount of thermal energy that needs to be supplied to a melt by conductive heating.

Further, the passive heater helps prevent line-of-sight projectiles from reaching a radially inner portion of the melt zone during the addition of solid feedstock material by providing a physical barrier in the air-space between the radially inner portion of the melt zone and a radially outer portion of the melt in which the feedstock is added. Additionally, the configuration of the passive heater facilitates collecting and recycling evaporants of the melt. In particular, the passive heater is oriented and positioned such that evaporants from the melt, such as silicon vapor, condense on the passive heater, and fall back into the melt, thereby reducing material losses associated with evaporated feedstock material. The passive heater also enhances the reliability and prolongs the operating life of crystal growing systems by preventing melt evaporants from condensing on other reactive components of the system, such as the active heaters.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A system for growing a crystal ingot from a melt, the system comprising:
   a crucible assembly including a crucible and a weir separating an outer melt zone of the melt from an inner melt zone of the melt;
   a first heater configured to supply thermal energy to the melt by conduction through the crucible;
   a second heater configured to generate thermal radiation;
   a passive heater configured to supply thermal energy to the outer melt zone by transferring thermal radiation generated by the second heater to the outer melt zone, the passive heater being oriented at an angle of between about 30 degrees and about 50 degrees with respect to a surface of the melt; and
   a conical heat shield positioned radially inward from the passive heater, the conical heat shield angling downward toward a central opening for receiving the ingot.

2. The system of claim 1, wherein the passive heater is configured to supply thermal energy to the outer melt zone by reflecting thermal radiation generated by the second heater towards the outer melt zone.

3. The system of claim 2, wherein the passive heater is configured to supply thermal energy to the outer melt zone by emitting thermal radiation towards the outer melt zone in response to absorbing thermal radiation generated by the second heater.

4. The system of claim 1, wherein a total amount of thermal energy is supplied to the outer melt zone by at least the first heater, the second heater, and the passive heater, the passive heater configured to supply at least about 50% of the total amount of thermal energy supplied to the outer melt zone.

5. The system of claim 1, wherein the passive heater includes a heat reflective layer and an insulating layer, the heat reflective layer configured to reflect thermal radiation generated by the second heater towards the outer melt zone.

6. The system of claim 5, wherein the reflective layer includes at least one of graphite and silicon carbide.

7. The system of claim 1, wherein the passive heater is positioned above the outer melt zone.

8. The system of claim 1, wherein the passive heater has a generally frustoconical shape.

9. The system of claim 1, wherein the crucible includes a base and a sidewall, the first heater disposed proximate the base of the crucible and radially inward from the sidewall of the crucible, the second heater disposed radially outward from the sidewall of the crucible.

10. The system of claim 1, wherein the passive heater is positioned in direct line-of-sight with the second heater and the outer melt zone.

11. The system of claim 1, further comprising a feed system configured to feed solid feedstock material into the outer melt zone.

12. The system of claim 1, wherein the second heater is configured to generate visible light radiation.

13. The system of claim 1, wherein the second heater is configured to generate infrared radiation.

14. A system for growing a crystal ingot from a melt, the system comprising:
   a crucible assembly including a crucible and a weir separating an outer melt zone of the melt from an inner melt zone of the melt;
   a first heater configured to supply thermal energy to the melt by conduction through the crucible;
   a second heater configured to generate thermal radiation;
   a passive heater configured to supply thermal energy to the outer melt zone by transferring thermal radiation generated by the second heater to the outer melt zone, the passive heater having a generally frustoconical shape; and
   a conical heat shield positioned radially inward from the passive heater, the conical heat shield angling downward toward a central opening for receiving the ingot.

15. The system of claim 14, wherein the passive heater is configured to supply thermal energy to the outer melt zone by reflecting thermal radiation generated by the second heater towards the outer melt zone.

16. The system of claim 15, wherein the passive heater is configured to supply thermal energy to the outer melt zone by emitting thermal radiation towards the outer melt zone in response to absorbing thermal radiation generated by the second heater.

17. The system of claim 14, wherein a total amount of thermal energy is supplied to the outer melt zone by at least the first heater, the second heater, and the passive heater, the passive heater configured to supply at least about 50% of the total amount of thermal energy supplied to the outer melt zone.

18. The system of claim 14, wherein the passive heater includes a heat reflective layer and an insulating layer, the heat reflective layer configured to reflect thermal radiation generated by the second heater towards the outer melt zone.

19. The system of claim 18, wherein the reflective layer includes at least one of graphite and silicon carbide.

20. The system of claim 14, wherein the passive heater is positioned above the outer melt zone.

21. The system of claim 14, wherein the crucible includes a base and a sidewall, the first heater disposed proximate the base of the crucible and radially inward from the sidewall of the crucible, the second heater disposed radially outward from the sidewall of the crucible.

22. The system of claim 14, wherein the passive heater is positioned in direct line-of-sight with the second heater and the outer melt zone.

23. The system of claim 14, further comprising a feed system configured to feed solid feedstock material into the outer melt zone.

24. The system of claim 14, wherein the second heater is configured to generate visible light radiation.

25. The system of claim 14, wherein the second heater is configured to generate infrared radiation.

* * * * *